(12) United States Patent
Zarei (10) Patent No.: US 9,018,996 B1
(45) Date of Patent: Apr. 28, 2015

(54) CIRCUITS, ARCHITECTURES, APPARATUSES, ALGORITHMS AND METHODS FOR PROVIDING QUADRATURE OUTPUTS USING A PLURALITY OF DIVIDE-BY-N DIVIDERS

(75) Inventor: Hossein Zarei, Irvine, CA (US)

(73) Assignee: Marvell International Ltd., Hamilton (BM)

( * ) Notice: Subject to any disclaimer, the term of this patent is extended or adjusted under 35 U.S.C. 154(b) by 724 days.

(21) Appl. No.: 12/831,186

(22) Filed: Jul. 6, 2010

Related U.S. Application Data (60) Provisional application No. 61/225,750, filed on Jul. 15, 2009, provisional application No. 61/237,214, filed on Aug. 26, 2009.

(51) Int. Cl.
| | |
|---|---|
| H03K 21/00 | (2006.01) |
| H03K 23/00 | (2006.01) |
| H03K 25/00 | (2006.01) |
| H03K 3/00 | (2006.01) |
| H03K 5/13 | (2014.01) |
| H03H 11/16 | (2006.01) |
| H04B 1/7176 | (2011.01) |

(52) U.S. Cl.
CPC ................................. H04B 1/7176 (2013.01)

(58) Field of Classification Search
USPC ......... 327/105, 107, 115, 117, 118, 238, 254, 327/255, 291
See application file for complete search history.

(56) References Cited

U.S. PATENT DOCUMENTS

| | | | | |
|---|---|---|---|---|
| 3,571,728 | A * | 3/1971 | Andrea et al. | 377/48 |
| 7,180,349 | B2 * | 2/2007 | Leifso et al. | 327/217 |
| 7,425,850 | B2 * | 9/2008 | Widerin | 327/117 |
| 7,521,976 | B1 * | 4/2009 | Sudjian et al. | 327/199 |
| 7,535,277 | B2 * | 5/2009 | Suzuki | 327/254 |
| 8,368,434 | B2 * | 2/2013 | Tasic et al. | 327/115 |
| 2002/0097072 | A1 * | 7/2002 | Wakada et al. | 327/117 |
| 2010/0134154 | A1 * | 6/2010 | He | 327/115 |

* cited by examiner

*Primary Examiner* — Lincoln Donovan
*Assistant Examiner* — Colleen O Toole

(57) ABSTRACT

Circuits, architectures, a system and methods for providing quadrature output signals. The circuit generally includes a quadrature signal generator and a plurality of frequency dividers. The plurality of frequency dividers are each configured to receive a plurality of quadrature signal generator outputs at a first frequency and provide a plurality of outputs at a second frequency. The method generally includes providing a plurality of quadrature signals at a first frequency and dividing the first frequency of the quadrature signals by n, wherein n is an odd integer of at least 3, thereby providing a plurality of divided-by-n quadrature outputs at a second frequency, wherein the second frequency is about equal to the first frequency divided by n. The present disclosure further advantageously improves quadrature signal generation accuracy, reliability and/or performance.

12 Claims, 10 Drawing Sheets

CIRCUITS, ARCHITECTURES, APPARATUSES, ALGORITHMS AND METHODS FOR PROVIDING QUADRATURE OUTPUTS USING A PLURALITY OF DIVIDE-BY-N DIVIDERS

RELATED APPLICATIONS

This application claims the benefit of U.S. Provisional Patent Application Nos. 61/225,750, filed Jul. 15, 2009, and 61/237,214, filed Aug. 26, 2009, each of which is incorporated herein by reference in its entirety.

FIELD OF THE INVENTION

The present invention generally relates to the field of quadrature phase signal generation. More specifically, embodiments of the present invention pertain to circuits, architectures, systems, methods, algorithms and software for quadrature frequency generation using a plurality of divide-by-n frequency dividers.

BACKGROUND

A mixer is a nonlinear device that receives two input signals at different frequencies (e.g., f1 and f2) and provides an output signal that represents a combination of the input signals. For example, the output can have a frequency that is the sum of the two input frequencies (e.g., f1+f2), the difference between the two input frequencies (e.g., f1-f2), or equal to one of the input frequencies (e.g., f1 or f2). One type of mixer, an image reject mixer (IRM), is used in a number of RF and microwave applications. IRMs are typically used to prevent a sideband from converting to the intermediate frequency (IF) range. Removing the sideband removes image noise, which distorts the IRM output. To properly remove the sideband, IRMs utilize phase-cancellation techniques based on quadrature signals (e.g., a signal provided at phases of 0°, 90°, 180°, and 270°).

Conventional methods of generating quadrature signals can utilize a quadrature VCO (Voltage Controlled Oscillator), divide-by-two frequency dividers, and poly-phase filters. However, such methods may have several drawbacks. For example, quadrature signals generated using a VCO can have an undesirable phase noise associated with the signals, and the circuitry can have stability issues. Such methods may also require increased power compared to other methods of quadrature signal generation.

Quadrature signals provided by divide-by-two frequency dividers generally require the VCO to operate at a frequency of at least twice that of the local oscillator (LO) output frequency. This is required since divide-by-two dividers divide both the received 180° phases by two and the received frequency by two.

Figure 1:
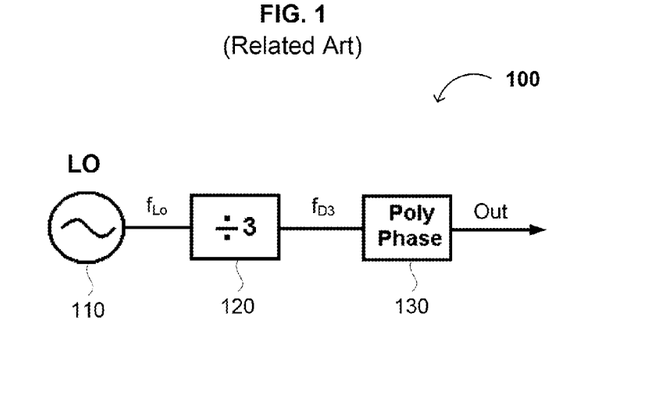
FIG. 1 is a block diagram showing one possible approach for a divide-by-three quadrature frequency generator.

FIG. 1 illustrates a conventional method of generating quadrature output signals at one-third of the VCO frequency by utilizing the poly-phase filter method described above. Local oscillator (LO) 110 provides a differential 180° sinusoidal signal at a first frequency (e.g., $f_{LO}$) to a divide-by-3 frequency divider 120. Divide-by-3 divider 120 then provides a square-wave output signal at $\frac{1}{3}^{rd}$ the input frequency (e.g., $f_{D3}$). Poly-phase filter 130 receives the output of the divide-by-3 divider 120 and provides a plurality of quadrature output signals as the output signal OUT. However, as described above with respect to divide-by-two dividers, divide-by-3 divider 120 not only divides the first frequency by three to produce a signal having a frequency $f_{D3}$, but it also divides the phases of the 180° input phases by three. As a result, the output phases of the divide-by-3 divider 120 are 60° apart. Thus, utilizing such a method to provide quadrature output signals requires a poly-phase filter 130 and the local oscillator (e.g., a VCO) to operate at a frequency three times greater than that of the output frequency. Additionally, poly-phase filter 130 works only with a sinusoidal input signal. Frequency dividers such as divide-by-3 divider 120 tend to generate signals having more of a square-wave form. When a square-wave signal is provided to a poly-phase filter, the quadrature output signals are distorted, and the $3^{rd}$ and $5^{th}$ order harmonics can become as close as 10 dB and 17 dB less than the $1^{st}$ order signal.

SUMMARY

Embodiments of the present invention relate to circuitry, architectures, systems, methods, algorithms and software for providing quadrature signals. The circuitry generally comprises a quadrature frequency generator, comprising a quadrature signal generator providing a plurality of outputs at a first frequency; and a plurality of frequency dividers, the plurality of frequency dividers configured to receive the plurality of outputs at the first frequency and provide a plurality of outputs at a second frequency. The architectures and/or systems generally comprise those that include a circuit embodying one or more of the inventive concepts disclosed herein. The method generally comprises providing a plurality of quadrature signals at a first frequency, dividing the frequency of the quadrature signals by n, where n is an odd integer greater than 1, and providing, a plurality of divided-by-n quadrature outputs at a second frequency, wherein the second frequency is about equal to the first frequency divided by n.

The present invention advantageously provides quadrature signals with little or no phase offset from the desired quadrature phase. These and other advantages of the present invention will become readily apparent from the detailed description below.

DETAILED DESCRIPTION

Reference will now be made in detail to various embodiments of the invention, examples of which are illustrated in the accompanying drawings. While the invention will be described in conjunction with the embodiments provided below, the embodiments are not intended to limit the invention. On the contrary, the invention is intended to cover alternatives, modifications and equivalents that may be included within the scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

All of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "determining," "transforming," or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "period" and "frequency" are generally used interchangeably herein, but are generally given their art-recognized meanings. Also, for convenience and simplicity, the terms "connected to," "coupled with," "coupled to," and "in communication with" (which terms also refer to direct and/or indirect relationships between the connected, coupled and/or communication elements unless the context of the term's use unambiguously indicates otherwise) may be used interchangeably, but these terms are also generally given their art-recognized meanings.

The present invention concerns a circuit, architecture, system, method, algorithm and software for quadrature signal generation. In various embodiments, the circuit generally comprises an oscillating signal generator providing a plurality of quadrature outputs at a first frequency, and a plurality of frequency dividers configured to provide a plurality of quadrature signals at a second frequency from the plurality of quadrature outputs. The architecture generally comprises the present circuit and/or any circuit embodying the inventive concepts described herein. For example, the present circuit can be used in conjunction with a frequency multiplier (or a frequency multiplier module) to produce quadrature output signals having a wide variety of frequency values. The invention, in its various aspects, will be explained in greater detail below with regard to various embodiments.

A Circuit and/or Architecture for Providing Quadrature Signals

Figure 2A:
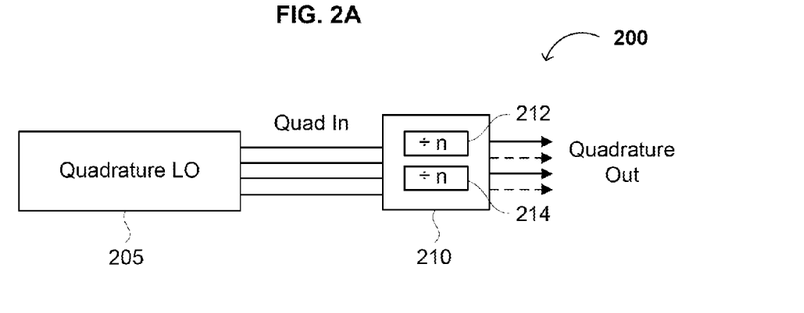
FIG. 2A is a block diagram showing a quadrature frequency generator according to an embodiment of the invention.

FIG. 2A shows a block diagram of a quadrature signal generator 200 according to a first embodiment. The quadrature signal generator 200 generally comprises a quadrature local oscillator 205 and a plurality of frequency dividers 210. The signals generated by quadrature signal generator 200 can be oscillating or periodic, can have a substantially sinusoidal waveform, and can have a predetermined frequency. Signal Quad In can be provided by, for example, a voltage controlled oscillator operating at twice the frequency of signal Quadrature Out, followed by a divide-by-two frequency divider. Alternatively, Quad In can be provide by a quadrature voltage-controlled oscillator (VCO) followed by a poly-phase filter (see, e.g., FIG. 2B). In general, four signals are generated, and the four signals may have phase differences of 0°, 90°, 180°, and 270° with respect to a reference signal (e.g., a predetermined edge or transition thereof), although the actual number of signals and the exact phase offset may vary. For example, referring to FIG. 2A, the quadrature signal generator 200 may produce two periodic signals (e.g., Quadrature Out) having a phase difference of 180° with respect to each other.

The quadrature local oscillator 205 provides a plurality of quadrature signals (e.g., Quad In) to a frequency divider module (FDM) 210. The quadrature local oscillator 205 can produce or generate signals Quad In with reference to a reference signal, such as a reference clock, at the local oscillator frequency ($f_{LO}$). Generally, the reference signal is provided at a frequency (e.g., $f_{LO}$) that allows proper operation of the frequency dividers 210.

FDM 210 receives the quadrature input signals (e.g., Quad In) and performs 2m+1 stages of frequency division, wherein m is an integer of at least 1, to provide quadrature output signals Quadrature_Out. Specifically, FDM 210 comprises a plurality of divide-by-n frequency dividers (e.g., divide-by-n frequency dividers 212 and 214), wherein each of the divide-by-n dividers 212 and 214 provides a pair of quadrature output signals (e.g., having phase differences of 0° and 180°, and of 90° and 270°, respectively). In general, n is an odd number of at least 3 (e.g., 2m+1).

Figure 2B:
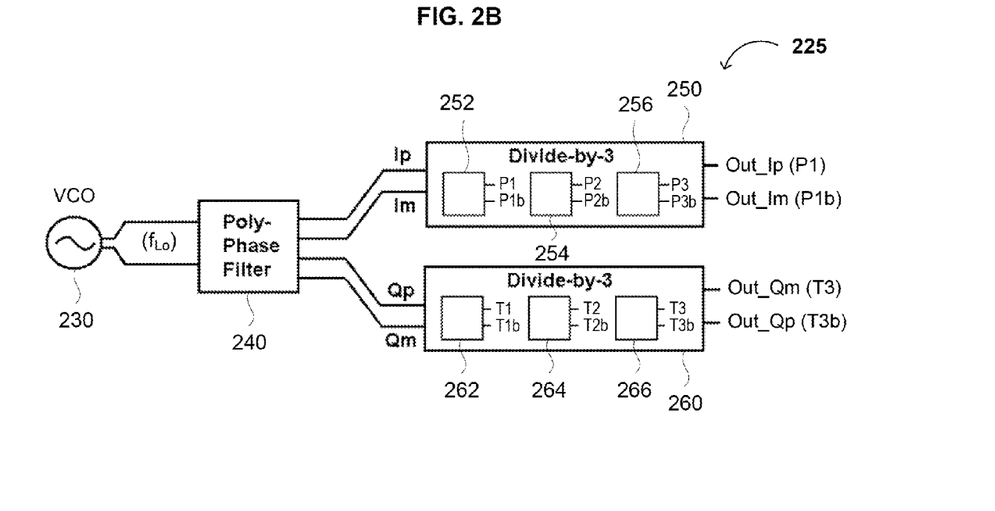
FIG. 2B is a more detailed block diagram of an embodiment of the quadrature frequency generator of FIG. 2A.

FIG. 2B is a more detailed block diagram showing a quadrature signal generator 225 according to the embodiment of FIG. 2A. The quadrature signal generator 225 of FIG. 2B generally comprises a local oscillator 230, a poly-phase filter 240, and a plurality of divide-by-3 frequency dividers 250 and 260. Local oscillator 230, which in various embodiments can be a voltage-controlled oscillator (VCO) or current-controlled oscillator, provides a sinusoidal signal at a first frequency, $f_{LO}$, to a polyphase filter 240. Polyphase filter 240 filters the received signal and provides a plurality of input signals (e.g., quadrature input signals $f_{LO}$ at 0° ($I_P$), 90° ($Q_P$), 180° ($I_M$), and 270° ($Q_M$)) to each of divide-by-3 dividers 250 and 260. For example, input signals $I_P$ and $I_M$ are received by first divide-by-three divider 250, and input signals Qp and Qm are received by second divide-by-3 divider 260. By providing the local oscillator signal to the polyphase filter 240 instead of to the divide-by-3 dividers, problems in the quadrature output signals due to application of a square wave form to a poly-phase filter (e.g., distortion) can be minimized or prevented.

As shown in FIG. 2B, first divide-by-three divider 250 comprises inverters clock buffer stages 252, 254, and 256, and second divide-by-three divider 260 comprises inverters clock buffer stages 262, 264, and 266. Each stage of the divide-by-3 dividers 250 and 260 may comprise an inverter (e.g., a differential inverter), a clock buffer, an optimal delay circuit or element (e.g., a resistor, a capacitor, etc.). Each stage 252, 254, 256, 262, 264, and 266 provides a quadrature output signal and an inverted quadrature output signal at a frequency $f_Q$, which is $\frac{1}{3}^{rd}$ the frequency of $f_{LO}$. For example, first stage 252 of first divider 250 provides a first output signal at P1 and a seventh output signal at P1b, wherein the output signal P1b is the inverse of the output signal P1. Similarly, second stage 254 provides a second output signal P2 and an eighth output stage signal P2b, wherein the output signal P2b is the inverse of the output signal P2. Quadrature output signals Out_Ip and Out_Im of the first divide-by-3 divider 250 are provided by the first stage 252 (i.e., true output P1 and its complement P1b), and quadrature output signals Out_Qp and Out_Qm of the second divide-by-three divider 260 are provided by the third stage 266 (i.e., true output T3 and its complement T3b). Thus, in one embodiment, only one of the inverter units in each of the plurality of divide-by-3 dividers provides quadrature output signals.

In various embodiments, the divider stages each comprise an inverter, a pair of cross-coupled inverters, a buffer, a delay circuit, a D-, SR-, JK-, or T-type latch or flip-flop, or any other circuit block configured to delay, store and/or invert a differential input signal. Thus, the divider stages may be edge-triggered or level-triggered. For example, each of the plurality of divide-by-3 frequency dividers can comprise a plurality of serially-connected flip-flops, each flip-flop being configured to provide a plurality of phase shifted output signals. For example, first stage 252 in divide-by-3 divider 250 may comprise a flip-flop configured to provide a true output signal with a 0° phase shift (e.g., P1) and a complementary output signal (e.g., P1b; i.e., the output signal phase-shifted by 180°). The remaining stages 254, 256, 262, 264, and 266 of dividers 250 and 260 may be similarly configured.

Importantly, with n=3, the outputs of successive stages in each of the two dividers 250 and 260 is provided with a phase difference of (360/n)°, or (360/3)°=120°. Thus, the output of the first stage 252 includes quadrature output signal Out_Ip (P1, with a phase offset at 0°) at P1, and quadrature output signal Out_Im (P1b, with a phase offset at) 180° (the complement of Out_Ip) at P1b. Additionally, the outputs of the second stage 254 include an output signal at P2 (120°) and its complement at P2b (300°), which corresponds to a 120° phase shift with respect to P2, i.e., 180°+120°. Similarly, an output signal at 240° is provided at P3 (i.e., P2 phase shifted 120°), and its complement (420°, provided as a 180° phase shift with respect to P3) is provided at P3b. Furthermore, an output signal having a phase shift of 30° with respect to input signal Ip is provided at T1 of the second divide-by-3 divider 260, which corresponds to a (90/n)° phase difference (Where n=3) between input signals Qp and Ip. T1b provides the complement of output signal T1 (i.e., an output signal at) 210°. T2 provides an output signal at 150° (i.e., T1 phase shifted 120°), and T2b provides an output signal at 330° (i.e., the complement of the output signal provided at T2). T3 provides quadrature output signal Out_Qm at 270°, and T3b provides quadrature output signal Out_Qp at 90° (the 450° complement is provided at a 90° phase; the complement of Out_Qm). Thus, the quadrature output signals are provided by stage 252 (P1 at 0°, P1b at 180°), and stage 266 (T3 at 270°, and T3b at 90°).

Figure 3A:
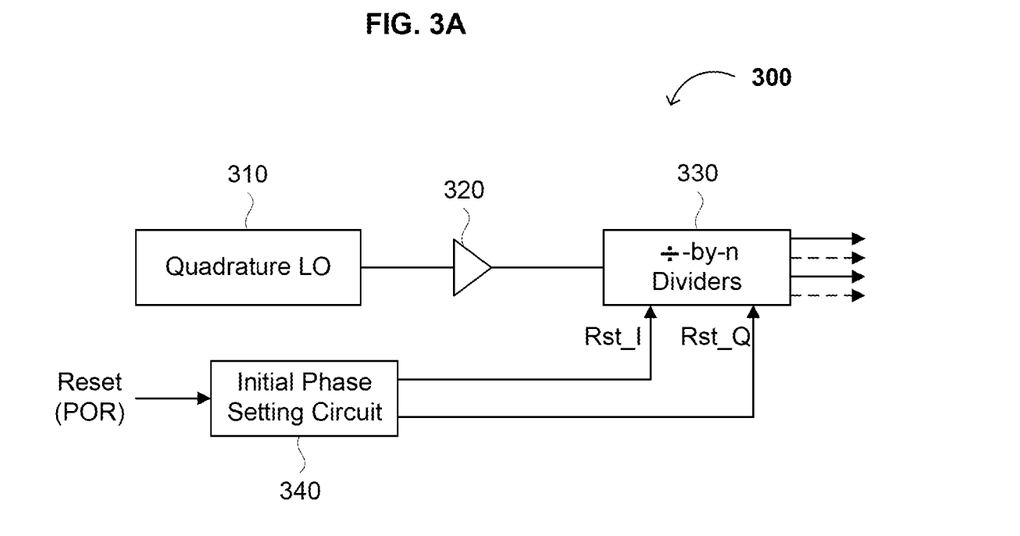
FIG. 3A is a block diagram showing a quadrature frequency generator comprising an initial phase setting (IPS) circuit.

FIG. 3A discloses a block diagram showing a quadrature signal generator 300 comprising an initial phase setting circuit 340 according to a first embodiment. The initial phase setting circuit 340 ensures accurate phase separation between a first set of quadrature output signals (e.g., Out_Ip and Out_Im in FIG. 2B) and a second set of quadrature output signals (e.g., Out_Qp and Out_Qm in FIG. 2B). Similar to the quadrature input signals in FIG. 2B, the input signals in FIG. 3A (shown as one signal) are provided by a quadrature local oscillator (LO) 310 to a quadrature buffer 320. Quadrature buffer 320 reproduces and optionally amplifies the quadrature signals (e.g., input signals Ip, Im, Qp, and Qm) for transmission to divide-by-n dividers 330. Divide-by-n dividers 330 may comprise a plurality of divide-by-n dividers (not shown in FIG. 3A, but represented by FDM 210 in FIG. 2A). The integer n is equal to the number of stages of frequency division. In one embodiment, the divide-by-n dividers 330 are programmable dividers configured to divide the quadrature oscillator signal by a user-programmed value n, in which n is an odd integer greater than 1.

Upon receiving a reset signal (e.g., a power on reset [POR] signal), initial phase setting circuit 340 provides a first reset signal Rst_I and a second reset signal Rst_Q to divide-by-n dividers 33Q. Reset signal Rst_I resets a first one of the divide-by-n dividers to ensure that the first divided-by-n output (e.g., P1 from the first divider 250 in FIG. 2B) is provided at a phase equal to that of the first quadrature input signal (e.g., Ip, having a phase offset of 0°). Reset signal Rst_Q resets a second one of the divide-by-n dividers to ensure that a second divided-by-n output (e.g., T3 from the second divider 260 in FIG. 2B) is provided at a phase equal to that of the third quadrature input signal (e.g., Qp, having a phase offset of 90°). Thus, since all remaining outputs in the first and second divide-by-n dividers 330 (FIG. 4) are phase-shifted by a factor of (360/n)° with respect to the previous stage, when resetting the first and second stages, all remaining stages in the first and second divide-by-n dividers 330 are also reset to provide the correct phase shift difference, as described herein. In one embodiment, initial phase setting circuit 340 provides first and second reset signals, wherein the second reset signal is provided at a time delay of ($T_{IN}/4$) with respect to the first reset signal, wherein $T_{IN}$ is the period of the first quadrature input signal and n is the number of stages in each divider of the divide-by-n dividers 330. Thus, for example, the quadrature signal generator illustrated in FIG.

Figure 3B:
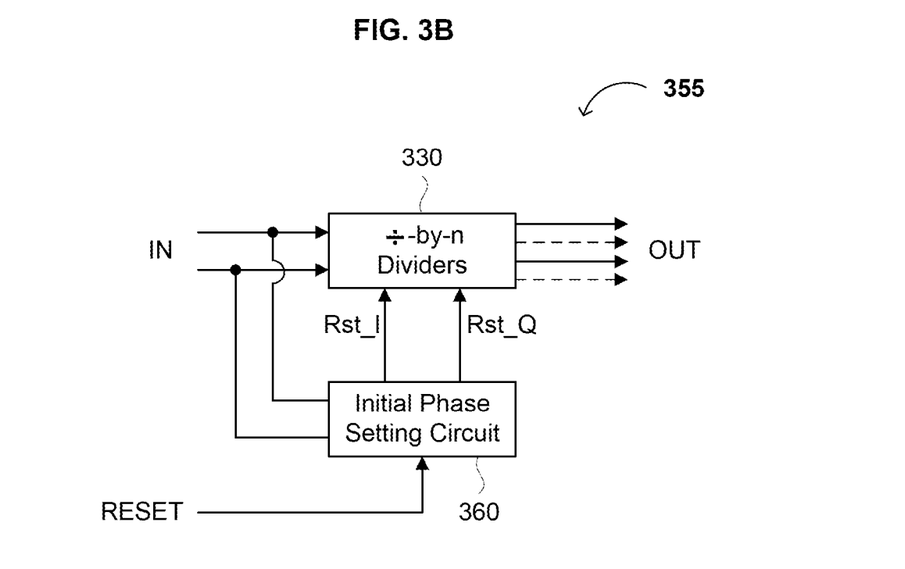
FIG. 3B is a block diagram of an alternative IPS circuit for a quadrature frequency generator.

2B, which comprises dual divide-by-3 frequency dividers, would provide a first reset signal at 0° and a second reset signal at (90/3)°=30° with respect to the output frequency of the frequency dividers 330 (FIGS. 3A-B).

Referring now to FIG. 3B, a second embodiment 355 utilizing an initial phase setting circuit 360 is disclosed. Initial phase setting circuit 360 is configured to receive a reset signal (e.g., a POR signal) and input signals IN (e.g., Ip and Qp in FIG. 2B). Input signals IN are provided, in one embodiment, by a quadrature local oscillator (e.g., quadrature LO 310 in FIG. 3A or LO 205 in FIG. 2A). In a second embodiment, the quadrature signals IN are provided by a quadrature buffer (e.g., quadrature buffer 320 in FIG. 3A) or a polyphase filter (e.g., polyphase filter 240 in FIG. 2B). Initial phase setting circuit 360 then provides first and second reset signals Rst_I and Rst_Q to divide-by-n dividers 330, similar to FIG. 3A.

Upon initialization of the quadrature frequency generator (e.g., quadrature frequency generator 310 in FIG. 3A), the output signal of each stage of divide-by-n dividers 330 may be offset with respect to its input signal. However, by providing a reset signal to each of the dividers 330, all stages of the divide-by-n dividers 330 can be reset and become properly aligned with respect to the input signal. As illustrated in FIGS. 3A-B, upon receiving the signal RESET, the initial phase setting circuit 360 provides first and second reset signals Rst_I and Rst_Q to divide-by-n dividers 330 to reset the timing by which the divide-by-n dividers 330 operate on the input signal(s) (e.g., IN in FIG. 3B). This ensures that the quadrature output signal Out_Ip is aligned with a 0° quadrature input signal (e.g., the output at stage P1 in the first divider of FIG. 2B), and quadrature output signal Out_Qp is aligned with a 90° quadrature input signal (e.g., the output from the first stage in the second divider of FIG. 2B). In the embodiment of FIG. 3B, the initial phase setting circuit 360 further receives the input signal IN (or another, functionally similar reference signal) with which to align the reset signals with respect to the input signal.

Figure 4:
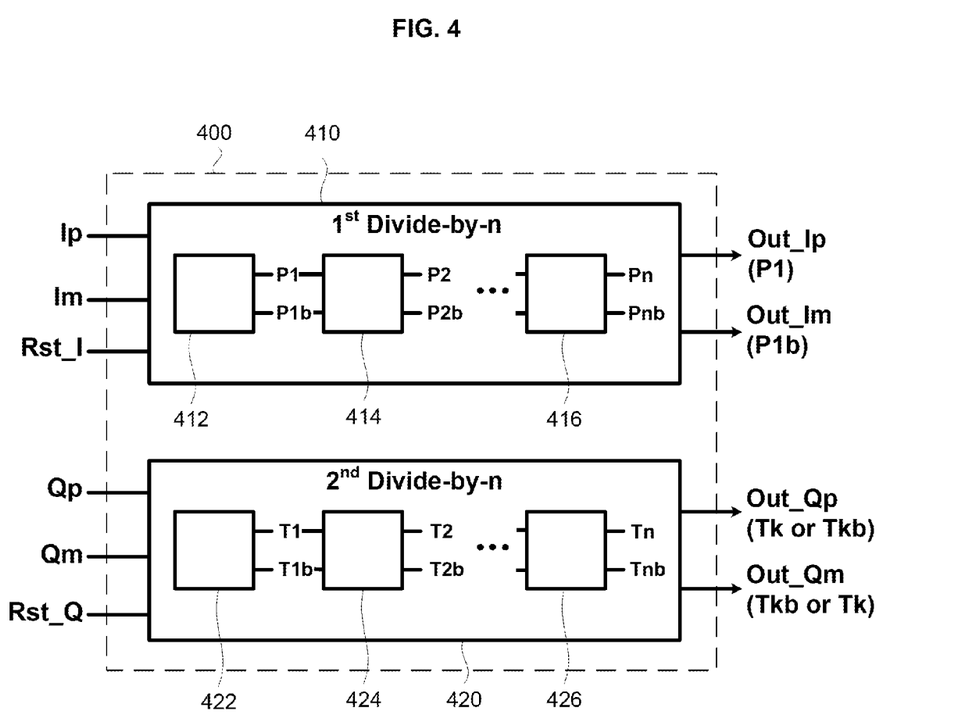
FIG. 4 is a detailed diagram of a divide-by-n frequency divider for a quadrature frequency generator.

FIG. 4 is a detailed diagram showing a divider 400 comprising first and second divide-by-n dividers 410 and 420, respectively. Each of the divide-by-n dividers 410 and 420 receives a reset signal (e.g., Rst_I or Rst_Q) and first and second quadrature input signals (e.g., Ip/Im and Qp/Qm, respectively). Additionally, each of the divide-by-n dividers comprises a plurality of divider stages (e.g., 412, 414, and 416), each configured to provide an output signal and its complement at a frequency less than that of the respective input frequency. Specifically, first divide-by-n divider 410 receives a first pair of true and complementary quadrature input signals Ip and Im, and second divide-by-n divider 420 receives a second pair of true and complementary quadrature input signals Qp and Qm.

Additionally, each of the divide-by-n dividers 410 and 420 provides true and complementary quadrature output signals (e.g., Out_Ip and Out_Im). For example, first divide-by-n divider 410 provides true quadrature output signal Out_Ip, selected from one of the plurality of divider stages therein (e.g., 412, 414, or 416). First divide-by-n divider 410 also provides the complement of Out_Ip, Out_Im, also selected from one of the plurality of divider stages therein. Similarly, second divide-by-n divider 420 provides true quadrature output signal Out_Qp, selected from one of the plurality of divider stages therein 420 (e.g., 422, 424, or 426). Second divide-by-n divider 420 also provides the complement of Out_Qp, Out_Qm, also selected from one of the divider stages therein. In one embodiment, the divider stages are serially coupled or connected.

True quadrature output signal Out_Ip provided by first divider stage 412 in the first divide-by-n divider 410 has the same phase (e.g., 0°) as quadrature input signal Ip. First divider stage 412 also provides a complementary quadrature output signal P1b (e.g., the inverted output P1). Divider stage 414 provides an output signal P2 at a phase shift of (360/n)° with respect to P1, and a second output signal P2b (e.g., an inverted output signal P2 having a phase offset of 180° with respect to output signal P2) at a phase shift of (360/n)° with respect to P1b. For example, with n=3, divider stage 414 provides an output signal P2 at a phase shift of 120° with respect to output signal P1. Similarly, with n=3, divider stage 414 provides a second output signal P2b at a phase shift of 300° with respect to quadrature input signal Ip.

Similarly, second divide-by-n divider 420 comprises delay stages 422, 424, and 426. In one embodiment, the stages are serially coupled or connected. Similar to the divide-by-3 dividers of FIG. 2B, the plurality of stages (i.e., 422, 424, and 426) in the second divide-by-n divider 420 are each configured to provide an output signal and its complement at a frequency less than that of the respective input frequency. The stages 422, 424, and 426 can also comprise any circuit block configured to delay and/or invert a differential input signal. As illustrated, T1 is the output of stage 422 and provides an output signal at a (360/n)°=(90/3)°=30° phase shift with respect to the output of first divider stage 412 (i.e., quadrature output signal Out_Ip). Similarly, the second stage 424 in the second divider 420 provides an output signal at T2 phase shifted (360/n)°=(360/3)°=120° with respect to T1. Thus, Tn, the output of the last stage 426 of second divide-by-n divider 420, is provided at a phase shift of (90/n)° with respect to output Pn of the n$^{th}$ stage 416 in the first divide-by-n divider 410. Similarly, T1b is the inverted (180° phase-shifted) output signal compared to T1, T2b is the inverted (180° phase-shifted) output signal compared to T2, and T3b is the inverted (180° phase-shifted) output signal compared to T3.

As discussed above, the local oscillator (e.g., LO 230 in FIG. 2B) provides a sinusoidal signal at a first frequency $f_{LO}$, and divide-by-n dividers 410 and 420 (FIG. 4) each provide quadrature output signals at a second frequency ($f_Q$). In various embodiments, the second frequency $f_Q$ is directly related to the number of stages in the dividers 410 and 420. Specifically, $f_Q$ is equal to the input frequency $f_{LO}$ divided by the number of inverters n in each of the divide-by-n dividers 410 and 420. For example, if an input frequency $f_{LO}$=120 Hz, and an output frequency $f_Q$ is to operate at 40 Hz, then each of the divide-by-n dividers 410 and 420 have 3 stages. Additionally, each of the stages provides true and complementary output signals, for a total of 2n output signals, each having a unique phase offset. However, as discussed above in the embodiment of FIG. 2B, generally, the output signals from only one stage of each divide-by-n divider provides the quadrature output signals from that divider. In general, the outputs from the first stage of the first divider (e.g., stage 252 in FIG. 2B or stage 412 in FIG. 4) are selected for providing the first subset (e.g., complementary pair) of quadrature output signals. The stage to be selected for providing the second subset (e.g., complementary pair) of quadrature output signals can be derived from the mathematical relationships shown below, wherein J is any positive integer of at least 1, n is equal to the number of frequency divisions performed on the reference signal (or stages in the divider), and K is the stage in the second frequency divider from which the second subset of quadrature output signals are selected.

To determine the proper number of stages n to provide quadrature signals at a desired second frequency, n can be equal to 4J−1, where J is any positive integer greater than 1.

Thus, n can equal 3 (i.e., when J is equal to 1), 7, 11, etc. K (the stage in the second divider from which the quadrature output signals are selected) is equal to 0.75(n+1). For example, if n=3 (i.e., J=1), then K=3, as illustrated in the embodiment of FIG. 2B. Therefore, the outputs of the third stage 266 in the second frequency divider 260 are selected to provide one pair of quadrature output signals. Thus, Out_Qm and Out_Qp are provided by T3 and T3b, respectively. The other pair of quadrature signals is provided by the output of the first stage of the first frequency divider 250 (i.e., phase P1 and its complement, P1b). That is, Out_Ip and Out_Im are provided by P1 and P1b, respectively.

Additionally, referring back to FIG. 4, if the required divisor n cannot be derived from the equation n=4J−1, then a second equation can be utilized, wherein n=4J+1. Thus, with J equal to any positive integer greater than 1, n=4J+1 (e.g., n=5, 9, 13, etc.), and K=0.25(n+3). For example, if a quadrature output frequency $f_Q$ is to have a frequency $\frac{1}{5}^{th}$ the input frequency $f_{LO}$, then n=5, J=1, and K=2. Therefore, since K=2, the outputs of the second stage (e.g., 424) in the second frequency divider 420 (i.e., equivalent to phases T2 and T2b) provide one pair of quadrature output signals, while the other pair of quadrature signals is provided by the outputs of the first stage of the first divider (e.g., 412, output phase P1 and its complement, P1b). Generally, the quadrature output signals Out_Qp and Out_Qm are provided by the $K^{th}$ stage of the second frequency divider 420 (i.e., stage output signals Tk and Tkb). Here, Out_Qp and Out_Qm are provided by Tk and Tkb, respectively, and Out_Ip and Out_Im are provided by P1 and P1b, respectively.

Figure 5:
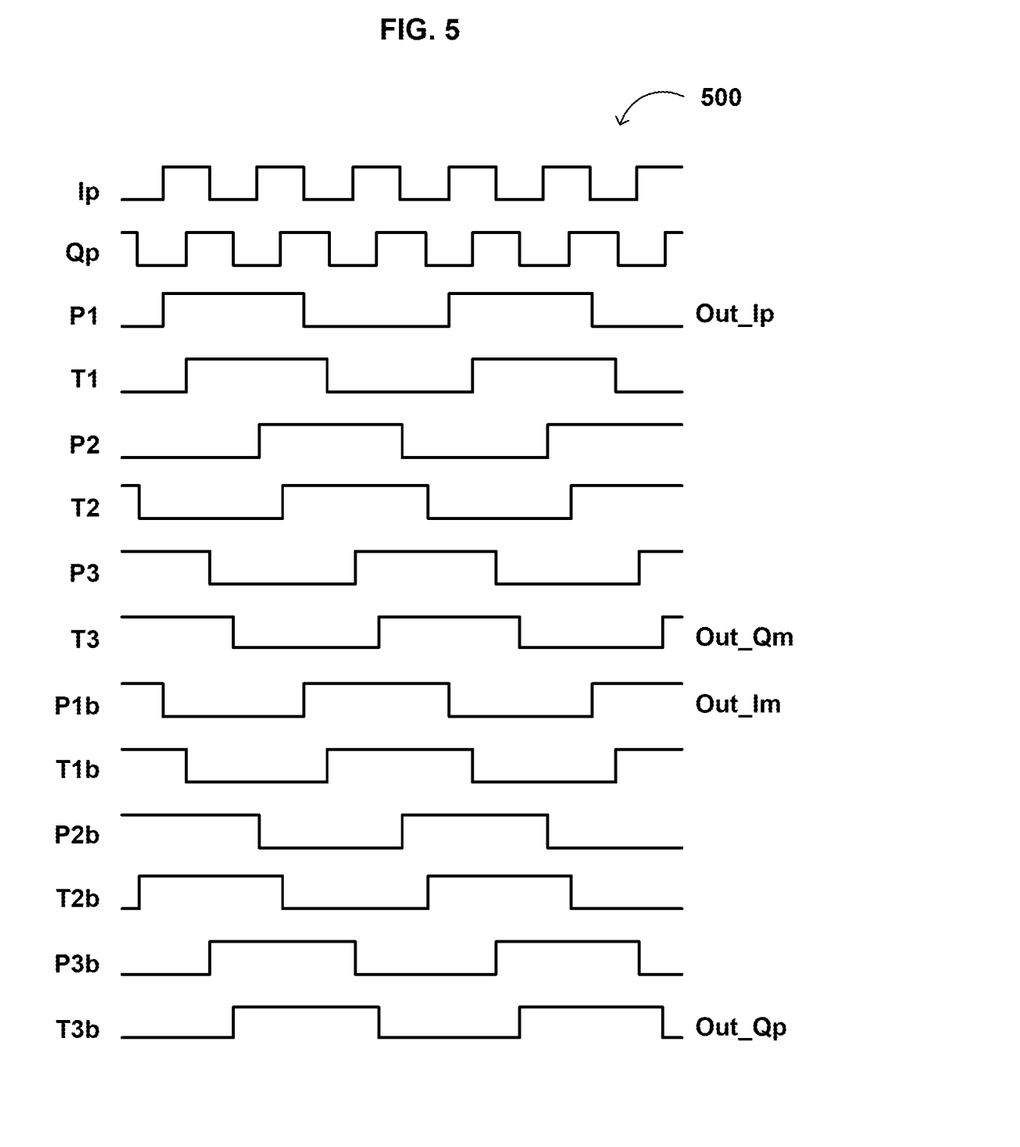
FIG. 5 is a timing diagram showing quadrature input signals Ip and Qp and the outputs of the divide-by-n divider stages, consistent with the embodiments of FIGS. 2B and 4.

FIG. 5 illustrates a timing diagram 500 for signals in the quadrature signal divider. 400 in FIG. 4 (where n=3) and divide-by-3 dividers 250 and 260 in FIG. 2B. As illustrated in the timing diagram 500, quadrature input signals Ip and Qp are provided at a first frequency. (Ip and Qp are shown having square wave forms, although in practice, the wave forms may be sinusoidal, trapezoidal, triangular [e.g., sawtooth], or a combination thereof.) Additionally, quadrature input signal Qp is delayed 90° with respect to quadrature input signal Ip. The remaining timing diagrams are provided by the output of each of a plurality of divider stages (e.g., 252, 254, 256, 262, 264, and 266 in FIG. 2B). Thus, referring to FIG. 4, timing signal P1 is provided by stage 412 of first divider 410, timing signal T1 is provided by stage 422 of second divider 420, P2 is provided by stage 414 of first divider 410, timing signal T2 is provided by stage 424 of second divider 420, and so on.

In comparing each of the output stage signals to the quadrature input signals, each of the output stage signals has a frequency that is $\frac{1}{3}^{rd}$ that of the respective input signals to the divider. As illustrated, assuming n=3, Out_Ip is phase shifted $(0/n)°=(0/3)°=0°$ with respect to input signal Ip. Similarly, as can be seen in the waveform for T1 (i.e., the output from the first stage 422 of the second divider 420), is phase-shifted $(90/3)°=30°$ with respect to input signal Ip. This is because Qp, the input to divider 420, is 90° phase-shifted compared to Ip, the input to divider 410. Additionally, the output of stage 414 in the first divide-by-n divider 410, as illustrated in the P2 timing diagram, is phase shifted $(360/3)°=120°$ with respect to output signal Out_Ip (PI). Similarly, the output of the stage 424 in the second divide-by-n divider 420, as illustrated in the T2 timing diagram, is phase shifted 120° with respect to output signal T1. Thus, the second stage 424 in the second divide-by-n divider provides an output signal at 150°.

Furthermore, the output of the third stage 256 in the first divide-by-3 divider 250 in FIG. 2B, as illustrated in the P3 timing diagram, is phase shifted $(360/3)°=240°$ with respect to output signal Out_Ip. Similarly, the output of the third delay block 266 in the second divide-by-3 divider 260, as illustrated in the T3 timing diagram, is phase shifted 240° with respect to output signal T1. Thus, the third stage 266 in the second divide-by-3 divider 260 provides quadrature output signal Out_Qm at $(240°+30°)=270°$, which is −90°, compared to P1 (Out_Ip). Therefore, the first stage 252 in the first divide-by-3 divider 250 in FIG. 2B provides quadrature output signal Out_Ip (P1 at 0°) and complementary output signal Out_Im (P1b at 180°), and the third stage 266 in the second divide-by-3 divider 260 provides quadrature output signal Out_Qm (T3 at −90°) and complementary output signal Out_Qp (T3b at 90°).

As shown in FIG. 5, input signals Ip and Qp and are provided with a phase difference of 90°. However, upon power-on, it may not be possible to determine or precisely establish the phase difference between the output signals (e.g., Out_Ip and Out_Im of first divide-by-n divider 250 and Out_Qp and Out_Qm of second divide-by-n divider 260 in FIG. 2B). For example, output signal T1 (FIG. 5) may be provided at a phase of, for example, 30° or 210° because the initial value, 0 (low logic level) or 1 (high logic level) for P1 can differ from the initial logic level for T1. Therefore, to ensure an accurate phase difference or phase shift during operation (e.g., a $(90/n)°=(90/3)°=30°$ phase difference between P1 and T1) upon power-on, first and second reset signals (e.g., Rst_I and Rst_Q in FIG. 3B) are provided such that a time delay of $T_{IN}/4$ exists between them.

Figure 6A:
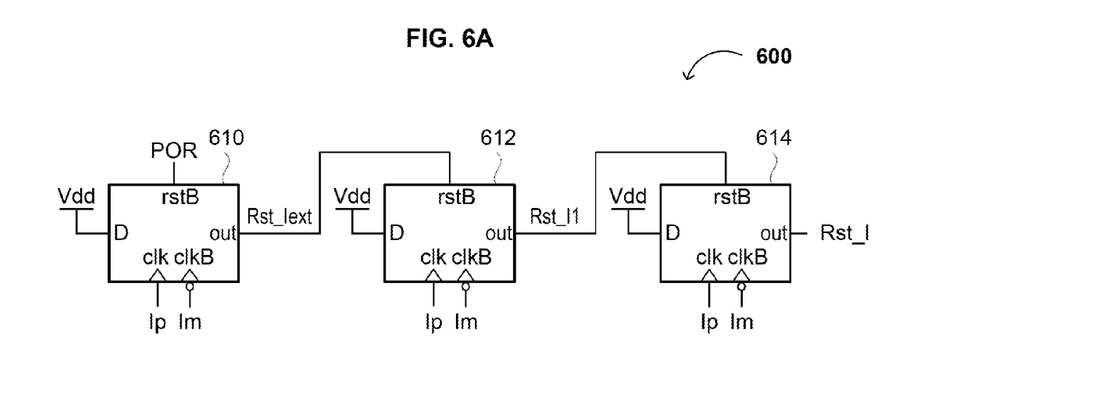
FIG. 6A is a detailed diagram of a first reset circuit providing a first reset signal.

First reset circuit 600 of FIG. 6A provides a first reset signal (e.g., Rst_I) that ensures that the output signals of a first divide-by-n divider are properly phase aligned with a first quadrature input signal (e.g., quadrature input signal Ip). First reset circuit 600 comprises storage elements 610, 612, and 614. Storage elements 610, 612, and 614 can each be a digital flip-flop or latch (e.g., a D, T, SR or JK latch or flip-flop), a buffer, or any other circuit block configured to store and/or delay a differential input signal. Thus, the storage elements may be edge-triggered or level-triggered, although edge-triggered storage elements are discussed herein. In the example of FIG. 6A, the D input for storage elements 610, 612, and 614 is a data input terminal, rstB is a reset input terminal, and clk and clkB are complementary clock input terminals.

All storage elements 610, 612, and 614 receive a power source Vdd, input signal Ip, and complementary input signal Im. The input signals provide (i) a reference with which to align the first reset signal, and/or (ii) a timing signal with which to provide the first reset signal as an output. The first reset signal Rst_I is provided to a first divider (e.g., first divide-by-n divider 250 in FIG. 2A and/or 410 in FIG. 4). A power-up or external reset signal (e.g., a power-on reset [POR] signal) is applied to reset terminal rstB in first storage element 610, which outputs an intermediate reset or pulse signal Rst_Iext to a successive storage element 612. The remaining storage elements (i.e., storage elements 612 and 614) receive the corresponding intermediate reset signals (e.g., Rst_Iext and Rst_I1) at their corresponding reset terminals rstB.

Upon receiving the POR signal, storage element 610 provides intermediate reset signal Rst_Iext (generally aligned to a rising edge of Ip) to a second storage element 612. Storage element 612 receives signal Rst_Iext and provides a second intermediate reset signal Rst_I1 to storage element 614. Storage element 614 then provides output signal Rst_I to a frequency divider (e.g., first divide-by-n divider 410 as shown in FIG. 4) on a rising transition of true quadrature input signal Ip. Rst_Iext, RstI, and Rst_I1 are discussed in greater detail below with respect to FIGS. 8 and 9.

Figure 6B:
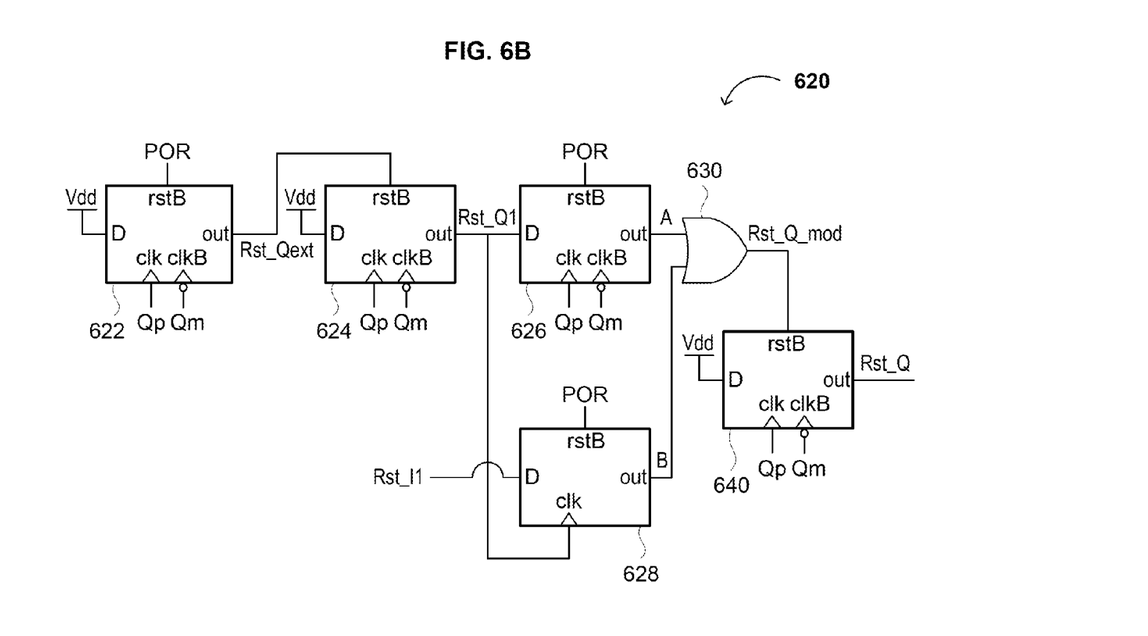
FIG. 6B is a detailed diagram of a second reset circuit providing a second reset signal.

FIG. 6B illustrates a second reset circuit 620 for one of a plurality of dividers (e.g., second divide-by-n divider 420 in FIG. 4). Second reset circuit 625 comprises storage elements 622, 624, 626, 628, and 640, similar to the data storage elements described above for first reset circuit 600 of FIG. 6A, and logic gate 630. As mentioned above, to ensure accurate phase differences among the quadrature output signals, Rst_Q must be provided at a time delay of $T_{IN}/4$. However, this time delay may be challenging to ensure upon power-on. Thus, to provide a second reset signal at a time delay of $T_{IN}/4$ relative to a first reset signal, a second reset circuit is provided.

Specifically, a power-on reset (POR) signal is applied to the reset terminal rstB of storage elements 622, 626, and 628. Storage element 622 receives input signals Qp and Qm, as well as a power source, Vdd. Power source Vdd is also coupled to the D input terminal of storage elements 624 and 640. In one embodiment, Vdd is a DC power source having a value of 5V, 3.3V, 2.5V, 1.8V, or any other value as may be determined in accordance with design choices. Storage elements 624, 626, and 640 are also configured to receive complementary quadrature input signals Qp and Qm at the corresponding timing signal terminals (e.g., clock input terminals). Upon receiving a POR signal, storage element 622 provides an intermediate reset signal Rst_Qext to the successive storage element 624. Storage element 624 receives the signal Rst_Qext and provides an internal reset signal Rst_Q1 to storage elements 626 and 628. Storage element 626 provides an output signal A to logic gate 630 in response to initial reset signal POR, Rst_Q1, and quadrature input signals Qp and Qm. Storage element 628 also receives Rst_I1 at its data input terminal, Rst_Q1 at its clock input terminal, and provides an output signal B to logic gate 630 in response to the two reset signals (i.e., Rst_I1 and Rst_Q1) and initial reset signal POR. Logic gate 630 provides an output signal Rst_Q_mod to the rstB input of storage element 640. Storage element 640 then provides reset signal Rst_Q to a divider (e.g., second divide-by-n divider 420 in FIG. 4). In one embodiment, logic gate 630 is an OR gate.

Figure 6C:
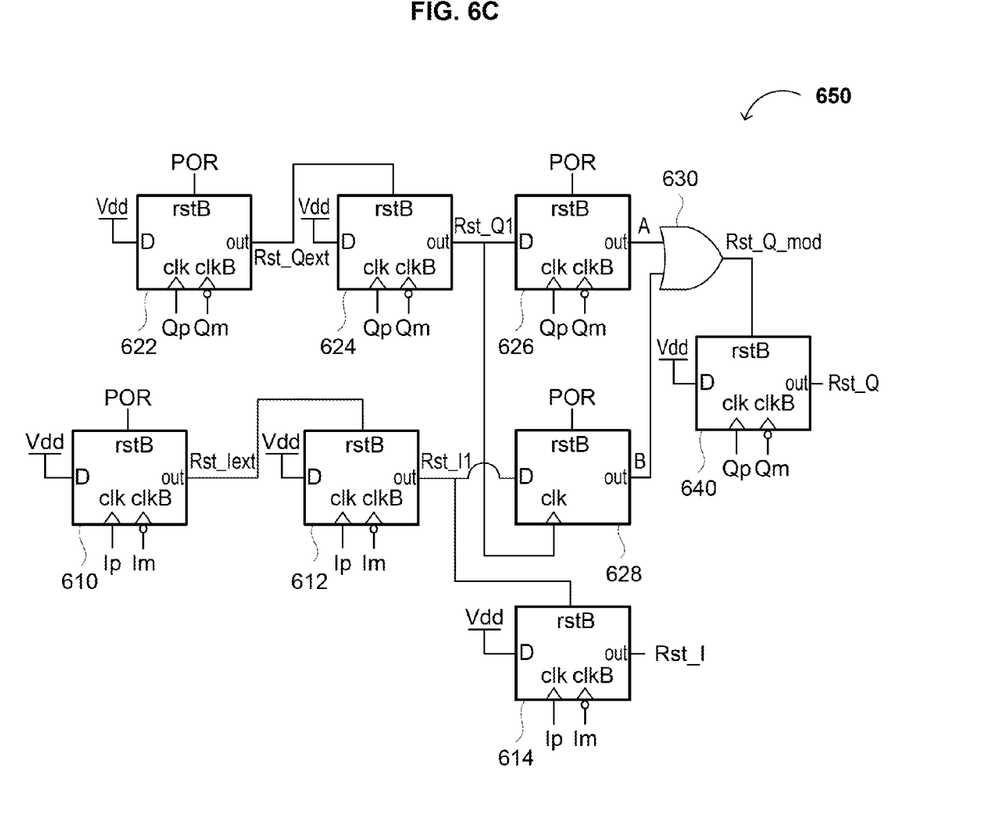
FIG. 6C is a detailed diagram of a reset circuit providing first and second reset signals.

FIG. 6C is an illustration of a reset circuit 650 combining the first and second reset circuits 600 and 620 of FIGS. 6A and 6B. Reset circuit 650 comprises a plurality of storage elements and logic gates configured to provide first and second reset signals to first and second frequency dividers (e.g., divide-by-n divider 410 and divide-by-n divider 420 of FIG. 4), respectively. In this embodiment, reset circuit 650 comprises the combination of first reset circuit 600 and second reset circuit 620 as shown in FIGS. 6A and 6B, respectively, operating in a method similar to that described above with respect to FIGS. 6A and 6B.

Figure 7:
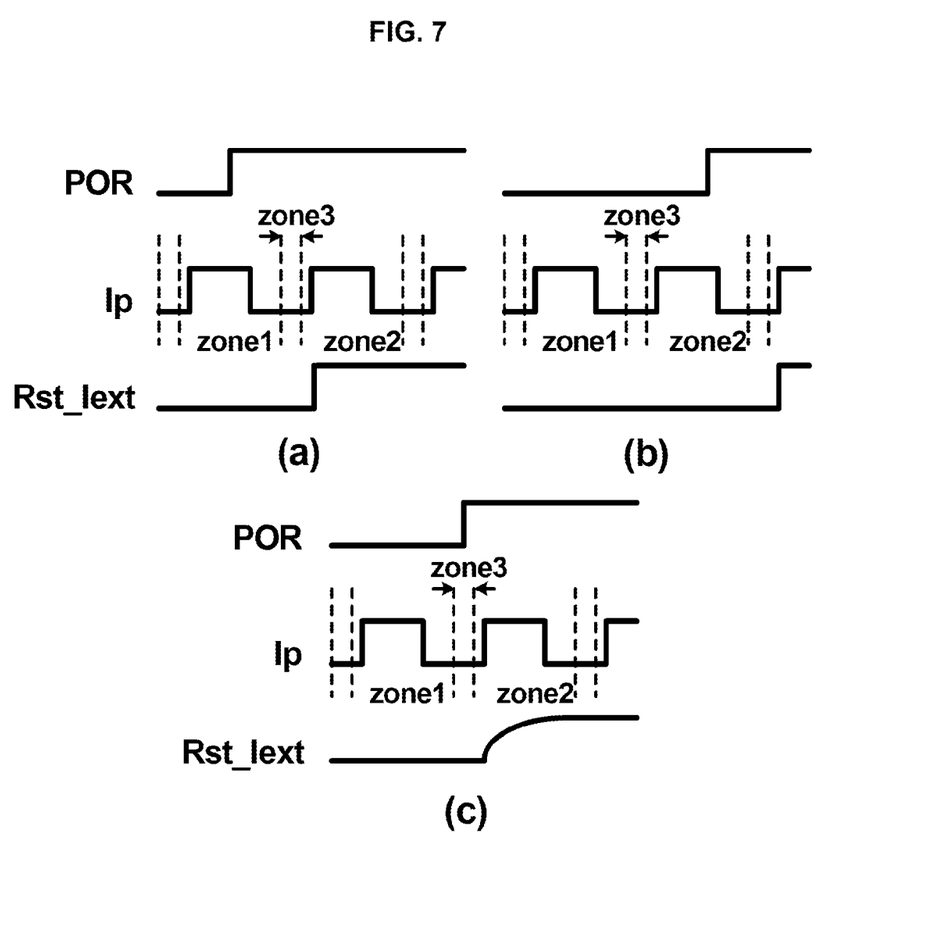
FIG. 7 is a timing diagram illustrating the timing of an asynchronous reset signal and a quadrature input signal on a storage element in the reset circuits of FIGS. 6A-6C.

FIGS. 7(a)-7(c) illustrate the different time zones for storage elements 610 and 622, in which the data input terminal (D) is connected to VDD, the reset terminal (rstB) is connected to the POR signal, and the clock terminal is connected to Ip (in the case of storage element 610 in FIGS. 6A and 6C) or Qp (in the case of storage element 622 in FIGS. 6B-6C). In the timing diagram of FIG. 7(a), a POR signal is asserted during a first timing zone, Zone 1. Zone 1 is representative of a time zone from just prior to a leading edge of the quadrature input signal Ip up to the beginning of Zone 3. Zone 2 is similar in time to Zone 1, but delayed by one period of Ip. The third zone, Zone 3, is representative of a time just after Zone 1, and prior to the second zone, Zone 2. Zone 3 can be a relatively small fraction of the period of Ip, prior to the leading edge of Ip in Zone 2 (i.e., the remainder of the first period of Ip not covered by Zone 1). Thus, the exact range of each of the time zones (i.e., Zone 1, Zone 2, and Zone 3) can vary depending on the circuit details of each storage element.

As illustrated in FIG. 7(a), when a POR signal is not detected (e.g., the POR is at a low logic state, a binary logic value of 0, or about 0V), the output of the storage element 610 (Rst_Iext) is a low logic state (e.g., binary logic level "0"). Upon transition of the POR signal, Rst_Iext (i.e., the output of storage element 610 in FIGS. 6A and 6C) is stored or latched on the next sequential leading edge of the quadrature input signal Ip (i.e., the leading edge of Ip in Zone 2). In this case, there is sufficient time separating the transition of the POR signal from the next leading edge of timing signal Ip.

FIG. 7(b) provides timing diagrams similar to those of FIG. 7(a). However, the POR signal transitions during Zone 2. As shown in the Rst_Iext timing diagram, Rst_Iext is latched on the next leading edge of the input signal Ip. Thus, similar to the situation when POR transitions during Zone 1, there is sufficient time between transitions of the POR signal and the next sequential leading edge of Ip for Rst_Iext to be stored or latched.

FIG. 7(c) provides timing diagrams similar to those of FIGS. 7(a)-7(b), except that the POR signal transitions during Zone 3. As shown in the Rst_Iext timing diagram, Rst_Iext may fail to latch on the next leading edge of the input signal Ip. The rise time required for Rst_Iext to reach a high logic state (e.g., a binary logic value of 1, about +5V, or Vdd, in various examples) may not occur until after the occurrence of the next sequential leading edge of Ip. As a result, a reset circuit that takes into consideration the timing requirements for Zone 3 is provided.

Specifically, referring back to circuit 650 of FIG. 6C, storage elements 610 and 622 are included to provide an additional clock period (e.g., $T_{IN}$) to allow signals Rst_Iext and Rst_Qext to obtain their steady state value (e.g., a logic high, or a voltage value of about +5V in one example). The effect of the delay on the output signals of storage elements 612 (i.e., Rst_I) and 624 (i.e., Rst_Q) is negligible, since these signals remain synchronized with input clock signals Ip and Qp, respectively.

Figure 8A:
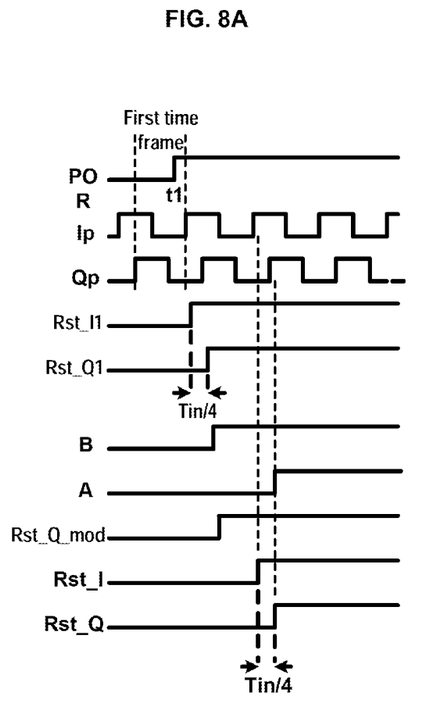
FIGS. 8A and 8B are diagrams illustrating the timing of an initial phase setting circuit suitable for use in a quadrature frequency generator.
Figure 8B:
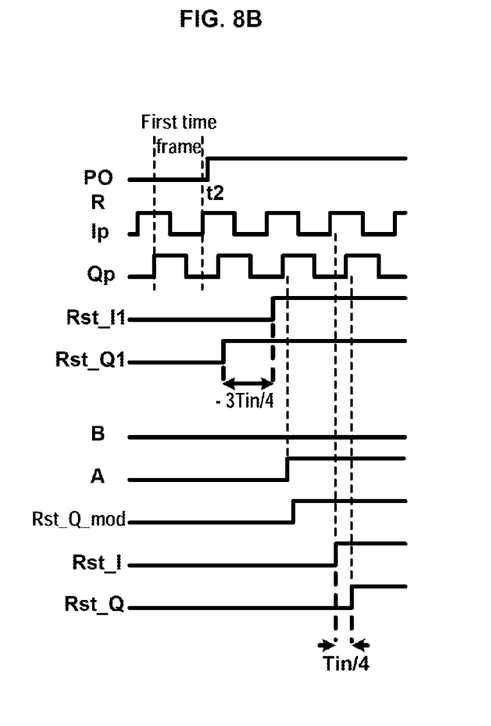

FIGS. 8A and 8B illustrate the timing diagrams for the initial phase setting circuit 650 of FIG. 6C. Although there are three timing zones for individual storage elements receiving the POR signal, there are only two timing cases for a reset circuit providing first and second reset signals (e.g., the reset circuit 650 of FIG. 6C). The two timing cases are a result of storage elements 610 and 622 synchronizing their output signals (Rst_Iext and Rst_Qext) with their clock input signals 1p and Qp, respectively. Also, their outputs of storage elements 626 and 628 (A and B) are at a logic level "0" when POR is at "0". When POR transitions to a high logic level "1", A and B can also transition to a high logic level "1" after the next edge of their respective clocks (Qp and Rst_Q1, respectively) if their respective data input terminals Rst_Q1 and Rst_I1 become high. A first timing case is one in which the POR signal transitions when Rst_I1 is leading Rst_Q1 by $0.25T_{IN}$ (90°), and a second timing case is one in which the POR signal transitions when Rst_I1 is lagging Rst_Q1 by $0.75T_{IN}$ (270°).

Specifically, FIG. 8A illustrates the first timing case in which Rst_I1 is leading Rst_Q1 by $0.25T_{IN}$. As illustrated, during the first time frame, the POR signal transitions at a time t1, before the leading edge of the timing signal Ip. As a result, Rst_I1 and Rst_Q1 are latched on the next sequential leading edges of Ip and Qp, respectively. Similarly, FIG. 8B illustrates a second timing case in which Rst_I1 is lagging Rst_Q1 by $0.75T_{IN}$. As illustrated, the POR signal transitions at a time t2, after the leading edge of the timing signal Ip, but before the leading edge of the timing signal Qp. As a result, Rst_Q1 is latched before Rst_I1, since the next sequential leading edge of Qp (with respect to time t2) occurs before the next leading edge of Ip.

For the timing case illustrated in FIG. 8B, Rst_I1 and Rst_Q1 may not function to properly reset the first and second dividers (e.g., divide-by-n dividers 410 and 420 of FIG. 4) since Rst_Q1 latches before Rst_I1, and there is a time difference of $0.75T_{IN}$ between Rst_Q and Rst_I, caused by the hold times of storage elements 612 and 624. With such disparate time differences, if Rst_I1 and Rst_Q1 were applied to two frequency dividers (e.g., 410 and 420 in FIG. 4), the POR signal could cause the first reset signal Rst_I1 to change state after the second reset signal Rst_Q1, leading to inaccurate quadrature output signals (e.g., Out_Ip, Out_Im, Out_Qp, and Out_Qm in FIG. 4).

To provide accurate quadrature output signals (e.g., Out_Ip and Out_Qp), additional logic is included to correct the Rst_Q1 and Rst_I1 timing so that Rst_I always leads Rst_Q by $0.25T_{IN}$, as shown in FIG. 8A. Referring back to FIG. 6C, the additional logic (e.g., storage elements 626 and 628, and logic gate 630) introduces a time delay between the time that the POR signal is detected and the time at which the second reset signal is provided. Specifically, storage element 626 provides output signal A, which is equivalent to Rst_Q1 with a one period (e.g., $T_{IN}$) time delay, where $T_{IN}$ is the period of quadrature input signal Ip. Storage element 628 then determines whether Rst_I1 is leading Rst_Q1. When Rst_I1 is leading Rst_Q1, signal B has a high logic state (e.g., a binary logic value of 1, about +5V, Vdd, etc.). A high logic state signal B results in logic gate 630 providing a high logic state Rst_Q_mod signal to storage element 640. Rst_Q, provided by storage element 640, is equivalent to Rst_Q_mod with a one period time delay introduced by storage element 628 and logic gate 630. Additionally, depending on the device parameters of the storage elements involved in the reset circuit 650, Rst_Q can be provided at a different time delay.

In a second timing case for a reset circuit providing first and second reset signals (e.g., the reset circuit 650 of FIG. 6C), as shown in FIG. 8B, Rst_I1 is lagging Rst_Q1 by $3T_{IN}/4$. Since Rst_Q1 is leading Rst_I1, signal B from storage element 628 is at a low logic level (e.g., a binary logic value of 0, about 0V, etc.). However, when signal A is at a high logic level, the output of logic gate 630, Rst_Q_mod, is also at a high logic level. Since signal A is equivalent to Rst_Q1 with a one period time delay, the output of logic gate 630, Rst_Q_mod, is also delayed by one time period with respect to Rst_Q1. Thus, the circuit of FIG. 6C provides a time delay such that Rst_I1 leads Rst_Q_mod by $T_{IN}/4$, and Rst_I leads Rst_Q.

To compensate for the delay added by the additional circuitry, storage elements 614 and 640 are utilized. Specifically, storage elements 614 and 640 synchronize Rst_I1 and Rst_Q_mod with input signals. Ip and Qp, respectively. Storage element 640 utilizes signal Rst_Q_mod instead of signal Rst_Q, which delays signal Rst_Q1 until the next sequential transition of input signal Qp. The signals provided by storage elements 614 and 640 (i.e., Rst_I and Rst_Q) are provided at a $T_{IN}/4$ time delay, regardless of the timing of the POR signal with respect to Ip and Qp. Thus, providing reset signals Rst_I and Rst_Q at a consistent $T_{IN}/4$ time delay ensures that quadrature output signals can be provided from the frequency dividers (e.g., first and second frequency dividers 410 and 420 in FIG. 4) at a $T_{IN}/4$ time delay.

A Method for Providing Quadrature Signals

Figure 9:
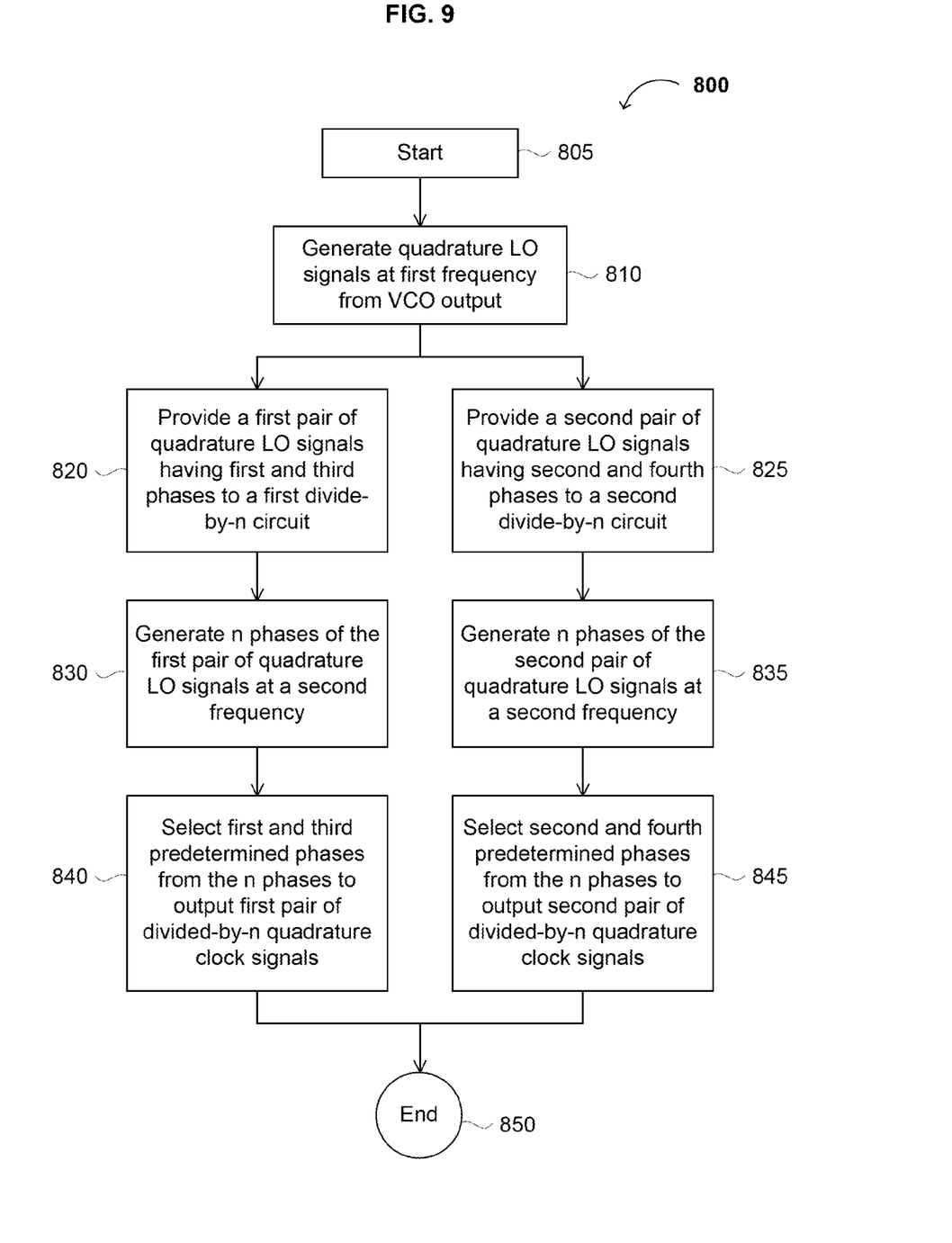
FIG. 9 is a flow diagram showing a method of generating quadrature oscillator signals according to an embodiment of the invention.

FIG. 9 shows a flow chart 800 illustrating a method of providing quadrature signals. In one embodiment, the quadrature signals comprise quadrature timing signals having a predetermined or fixed frequency and a predetermined or fixed phase offset or difference from each other. At 805, the method begins, and at 810, quadrature local oscillator signals having a first frequency are generated from and output by a VCO. The quadrature local oscillator signals can be generated by any capable circuit, including but not limited to a quadrature VCO, a VCO and poly-phase filter, or a VCO and a divide-by-2 frequency divider. At 820, a first pair of quadrature local oscillator signals having first and third phases (e.g., 0° and 180°) are provided to a first divide-by-n circuit (e.g., divide-by-3 divider 250 in FIG. 2B). Additionally, and in parallel, at 825, a second pair of quadrature local oscillator signals having second and fourth phases (e.g., 90° and 270°) are provided to a second divide-by-n circuit (e.g., divide-by-3 divider 260 in FIG. 2B).

At 830, n phases of the first pair of quadrature local oscillator signals are generated. In one embodiment, the n phases are generated at successive phase shifts of (360/n)° with respect to the initial phases. Each of the n phases has a second frequency, wherein the second frequency is equal to the first frequency divided by n. Additionally, and in parallel, at 835, n phases of the second pair of quadrature local oscillator signals are generated. Like for the first pair of quadrature local oscillator signals, in one embodiment, the n phases of the frequency-divided second quadrature local oscillator signals are generated at successive phase shifts of (360/n)° with respect to each of the initial phases, and each of the n phases has a second frequency equal to the first frequency divided by n.

At 840, two predetermined phases of the n phases of the frequency-divided first quadrature local oscillator signals are selected, to thereby output a first pair of divided-by-n quadrature signals (i.e., the first and third phases of the quadrature output signals). Similarly, and in parallel, at 845, two predetermined phases of the n phases of frequency-divided second quadrature local oscillator signals are selected, to thereby output a second pair of divided-by-n quadrature signals (i.e., the second and fourth phases of quadrature output signals). Selection criteria for providing first and second pairs of quadrature output signals may be similar to that discussed above with respect to FIG. 4. After the phases of the divided-by-n quadrature output signals are selected, at 850, the method ends.

Figure 10:
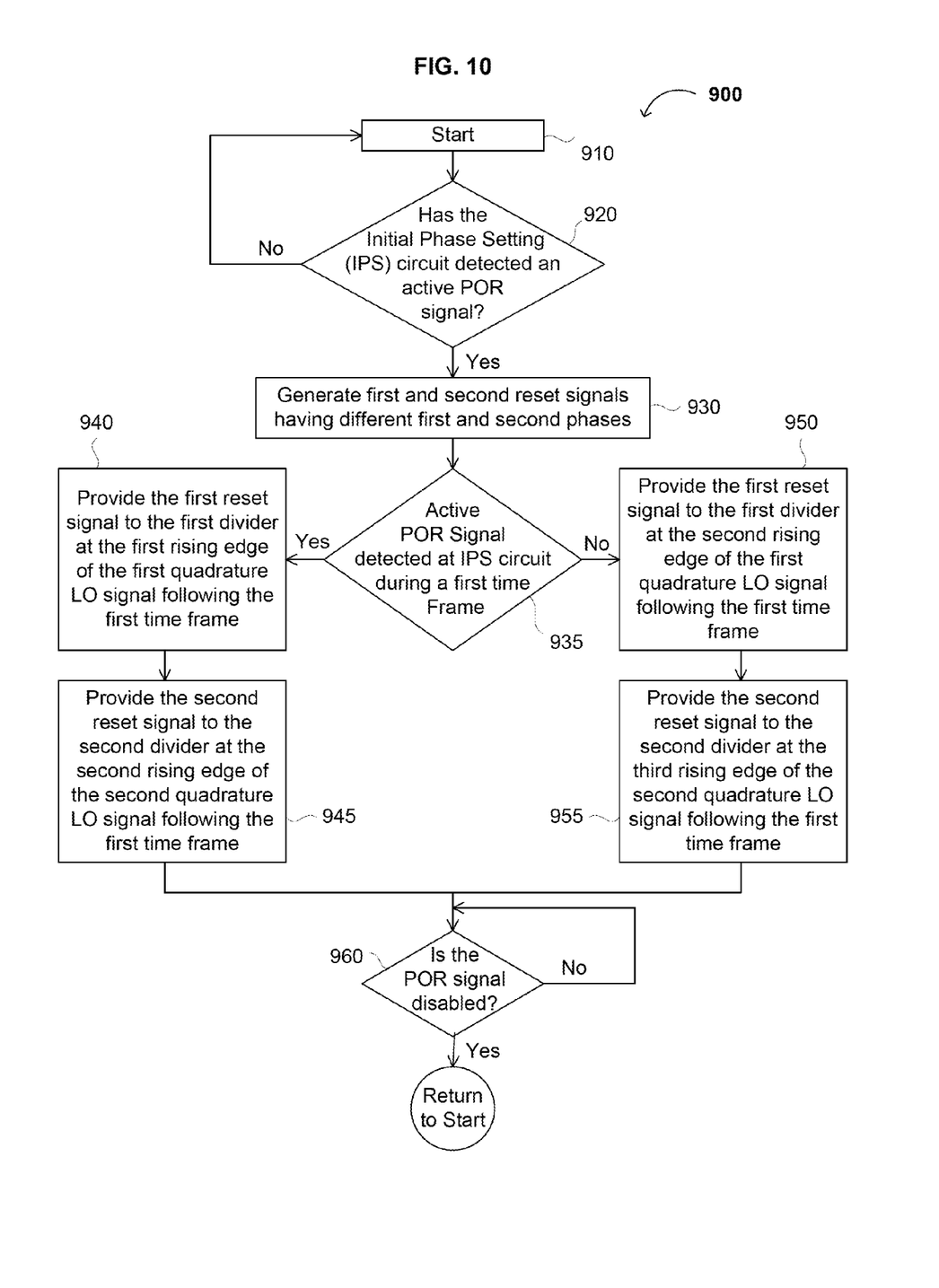
FIG. 10 is a flow diagram showing a method of applying first and second reset signals to a quadrature signal generator according to the embodiments of FIGS. 6A-6C, respectively.

FIG. 10 illustrates a second method 900 for providing correct first and second reset signals to a quadrature signal generator having two divide-by-n frequency dividers that generate quadrature output signals at a frequency of $f_{LO}/n$, where $f_{LO}$ is the frequency of quadrature input signal, and n is any odd integer greater than 1. At 910, the method begins and at 920, the method 900 determines if a power-up or reset signal (e.g., a POR signal) has been applied to an initial phase setting (IPS) circuit. The IPS circuit, in one embodiment, is at least equivalent to the reset circuit of FIG. 6C. If the method determines that a POR signal has not been detected, then the method returns to the state 910. If the method determines that a POR signal is detected, then the method proceeds to 930.

At 930, the method 900 generates first and second reset signals having different first and second phases. In one embodiment, the time delay between the first and second reset signals is $T_{IN}/4$ (where $T_{IN}$ is the period of the input signal to the frequency divider[s]). At 935, the method determines if the POR signal was detected by the IPS circuit during a first time frame, before transition of a first quadrature local oscillator signal. In one embodiment, the first time frame is between a rising transition of second quadrature local oscillator signal (Qp) and the next successive rising transition of first quadrature local oscillator signal (Ip; see, e.g., FIG. 8A).

Referring back to FIG. 10, if the method 900 determines that the POR signal has been received during the first time frame, then the method proceeds to 940. At 940, the method 900 provides a first reset signal (e.g., Rst_I in FIG. 6A) to a first divider (e.g., divide-by-3 divider 250 in FIG. 2B) at the first rising edge of the first quadrature local oscillator signal (e.g., Ip) following the first time frame. At 945, the method 900 provides a second reset signal (e.g., Rst_Q in FIG. 3B) to a second divider (e.g., divide-by-3 divider 260 in FIG. 2B) at the second rising edge of the second quadrature local oscillator signal (e.g., input signal Qp) following the first time frame. After applying both reset signals to the divide-by-n dividers, at 960, the method determines whether the POR signal is being disabled. If the POR signal is disabled, the method returns to 910. Otherwise, the method stays at 960.

If, however, the method 900 determines at 935 that the POR signal has not been received during the first time frame, then the method proceeds to 950. At 950, the method provides the first reset signal (e.g., Rst_I of FIG. 6A) to the first divider (e.g., divide-by-3 divider 250 in FIG. 2B) at the second rising edge of the first quadrature local oscillator signal (e.g., Ip) following the first time frame. At 955, the method 900 provides a second reset signal (e.g. Rst_Q in FIG. 6A) to a second divider (e.g., divide-by-3 divider 260 of FIG. 2B) at the third rising edge of the second quadrature local oscillator signal (e.g., Qp) following the first time frame. Again, after applying both reset signals to the dividers, at 960, the method determines whether the POR signal is being disabled. If the POR signal is disabled, the method returns to 910. Otherwise, the method stays at 960.

CONCLUSION/SUMMARY

Thus, embodiments of the present disclosure provide a circuit, architecture, system and method for providing quadrature frequency signals that may have sinusoidal waveforms with little phase offset, and without the high power requirements of related methods.

The foregoing descriptions of embodiments of the present disclosure have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

The invention claimed is:

1. A frequency generator comprising:
a signal generator configured to provide, at a first frequency, (i) a first input signal, (ii) a second input signal, (iii) a third input signal, and (iv) a fourth input signal, wherein the second input signal, the third input signal, and the fourth input signal are respectively phase-shifted from the first input signal by 180, 90, and 270 degrees;
a first frequency divider configured to
receive the first input signal and the second input signal, and
output 2n output signals at a second frequency, wherein the second frequency equals the first frequency divided by an odd integer n of at least three, and wherein the output signals are evenly phase-shifted apart by 360/2n degrees; and
a second frequency divider configured to
receive the third input signal and the fourth input signal, and
output 2n output signals that are
at the second frequency,
evenly phase-shifted apart by 360/2n degrees, and
each phase-shifted by 360/4n degrees from a corresponding one of the output signals from the first divider, such that the first divider and the second divider together provide 4n output signals that are evenly phase-shifted apart by 360/4n degrees;
wherein each frequency divider includes a series of n delay stages that are serially coupled together and that include a first stage and subsequent stages;
wherein each stage has two mutually-inverse outputs that provide two of the respective divider's 2n output signals; and
wherein each stage imparts a phase delay of 360/n degrees, such that in each respective divider:
the outputs of each subsequent stage are phase delayed, by the subsequent stage, by 360/n degrees from the corresponding outputs of the stage that immediately precedes the subsequent stage in the respective divider.

2. The frequency generator of claim 1, wherein the signal generator generates the first input signal, the second input signal, the third input signal, and the fourth input signal as sinusoidal signals.

3. The frequency generator of claim 1, wherein the signal generator generates the first input signal, the second input signal, the third input signal, and the fourth input signal as square-wave signals.

4. The frequency generator of claim 1, wherein each stage comprises a delay device.

5. The frequency generator of claim 1, wherein the delay device comprises a resistor and a capacitor.

6. The frequency generator of claim 1, wherein each stage comprises a flip-flop.

7. The frequency generator of claim 1, wherein at least one of the output signals of the second frequency divider is phase-delayed 90 degrees from a stage output of the first stage of the first frequency divider.

8. The frequency generator of claim 1, further comprising an initial phase setting circuit configured to provide (i) a first reset signal to the first frequency divider and (ii) a second reset signal to the second frequency divider.

9. The frequency generator of claim 8, wherein the first reset signal is separated by 360/4n degrees from the second reset signal.

10. The frequency generator of claim 8, wherein the first reset signal is output to the first stage of the first frequency divider, and the second reset signal is output to the first stage of the second frequency divider.

11. The frequency generator of claim 1, wherein the frequency divider is programmable such that the integer n is user selectable.

12. The frequency generator of claim 1, wherein the output signals are sinusoidal.

* * * * *